United States Patent
Connally et al.

(10) Patent No.: US 7,328,137 B2
(45) Date of Patent: Feb. 5, 2008

(54) METHODS AND SYSTEMS FOR DERIVATION OF MISSING DATA OBJECTS FROM TEST DATA

(75) Inventors: Carli Connally, Fort Collins, CO (US); Bryan F. Carpenter, Loveland, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 33 days.

(21) Appl. No.: 11/345,195

(22) Filed: Jan. 31, 2006

(65) Prior Publication Data
US 2007/0179755 A1    Aug. 2, 2007

(51) Int. Cl.
G06F 17/30  (2006.01)
G06F 17/40  (2006.01)
G06F 19/00  (2006.01)

(52) U.S. Cl. .................. 702/189; 702/85; 707/101; 707/103 R; 714/1; 714/2; 714/100; 714/746; 714/747

(58) Field of Classification Search .............. 702/85, 702/86, 127, 179, 189, 190; 707/101, 103 R; 714/1, 2, 15, 20, 100, 699, 701, 709, 746, 714/747
See application file for complete search history.

(56) References Cited

U.S. PATENT DOCUMENTS 2,965,300 A * 12/1960 Radley et al. .............. 708/806
2,987,704 A * 6/1961 Gimpel et al. ................ 346/34
3,166,736 A * 1/1965 Heminger ..................... 714/15
3,496,528 A * 2/1970 Brey ............................ 367/43
4,641,309 A * 2/1987 Nakano et al. ............. 714/747
5,568,639 A * 10/1996 Wilcox et al. .............. 707/200
5,664,189 A * 9/1997 Wilcox et al. .............. 707/205
6,530,055 B1 * 3/2003 Fukunaga .................... 714/746
6,606,629 B1 * 8/2003 DeKoning et al. .......... 707/100
6,609,125 B1 * 8/2003 Layne et al. .................... 707/6
6,919,568 B2 * 7/2005 Odogba et al. ......... 250/370.09

FOREIGN PATENT DOCUMENTS

EP          0 081 387 A1 *   6/1983

* cited by examiner

Primary Examiner—Edward R Cosimano

(57) ABSTRACT

In an embodiment, there is disclosed a system for derivation of missing data objects from test data. The system may include a data populator having code for: (1) generating data objects from the test data, (2) arranging the data objects in a tree structure, (3) deriving the missing data objects from the tree structure, and (4) populating the missing data objects into the tree structure; a data model in communication with the data populator; and a plurality of clients in communication with the data model. In an embodiment, a method of derivation of missing data objects from test data is disclosed. The method may include generating data objects from the test data; arranging the data objects in a tree structure; deriving the missing data objects from the tree structure; and populating the missing data objects into the tree structure. Other embodiments are also disclosed.

22 Claims, 10 Drawing Sheets

METHODS AND SYSTEMS FOR DERIVATION OF MISSING DATA OBJECTS FROM TEST DATA

BACKGROUND

Data is logged from a tester to represent events occurring on the tester. For example, there is an event for starting to test a lot. There is an event for starting to test a device. There is an event for execution of an individual test. The order of the events is important and provides context information. When an event is logged that signals the beginning of testing for a lot, all device test results that are logged after that point, and prior to an event signaling the end of a lot, are considered part of that lot.

Due to complexities of testing systems, and to allow flexibility in using the system, it is possible to have "missing events". These missing events in turn cause missing context information for the testing system. These missing events must be addressed for each of the processes prior to formatting test data. For example, to format data to a text report and to a binary STDF file, both of these processes need to compensate for the missing data.

In the past, each individual data formatter would provide its own solution for the missing data. For example, unique data relationships may be provided from one data formatter to another. Output data from some or all of the data formatters could be provided with holes or missing relationships. One or more of the data formatters could potentially crash.

SUMMARY OF THE INVENTION

In an embodiment, there is provided a system for derivation of missing data objects from test data, the system comprising a data populator having code for (1) generating data objects from the test data, (2) arranging the data objects in a tree structure, (3) deriving the missing data objects from the tree structure, and (4) populating the missing data objects into the tree structure; a data model in communication with the data populator, wherein the data model stores the data objects and the missing objects generated by the data populator; and a plurality of clients in communication with the data model, wherein the clients each selectively read the data objects and the missing data objects stored by the data model.

In another embodiment, there is provided a system for derivation of missing data objects from test data, the system comprising a data populator having code for: (1) generating data objects from the test data, (2) arranging the data objects in a relational structure relative to one another, (3) deriving the missing data objects from the relational structure, and (4) populating the missing data objects into the relational structure; and a plurality of clients in communication with the data populator, wherein the clients each selectively obtain the data objects and the missing data objects generated and derived by the data populator, respectively.

In yet another embodiment, there is provided a method of derivation of missing data objects from test data, the method comprising generating data objects from the test data; arranging the data objects in a tree structure; deriving the missing data objects from the tree structure; and populating the missing data objects into the tree structure.

In still another embodiment, there is provided a method of derivation of missing data objects from test data, the method comprising generating data objects from the test data; arranging the data objects in a relational structure relative to one another; deriving the missing data objects from the relational structure; and populating the missing data objects into the relational structure.

Other embodiments are also disclosed.

BRIEF DESCRIPTION OF THE DRAWINGS

Illustrative embodiments of the invention are illustrated in the drawings, in which.

DETAILED DESCRIPTION OF AN EMBODIMENT

Figure 1:
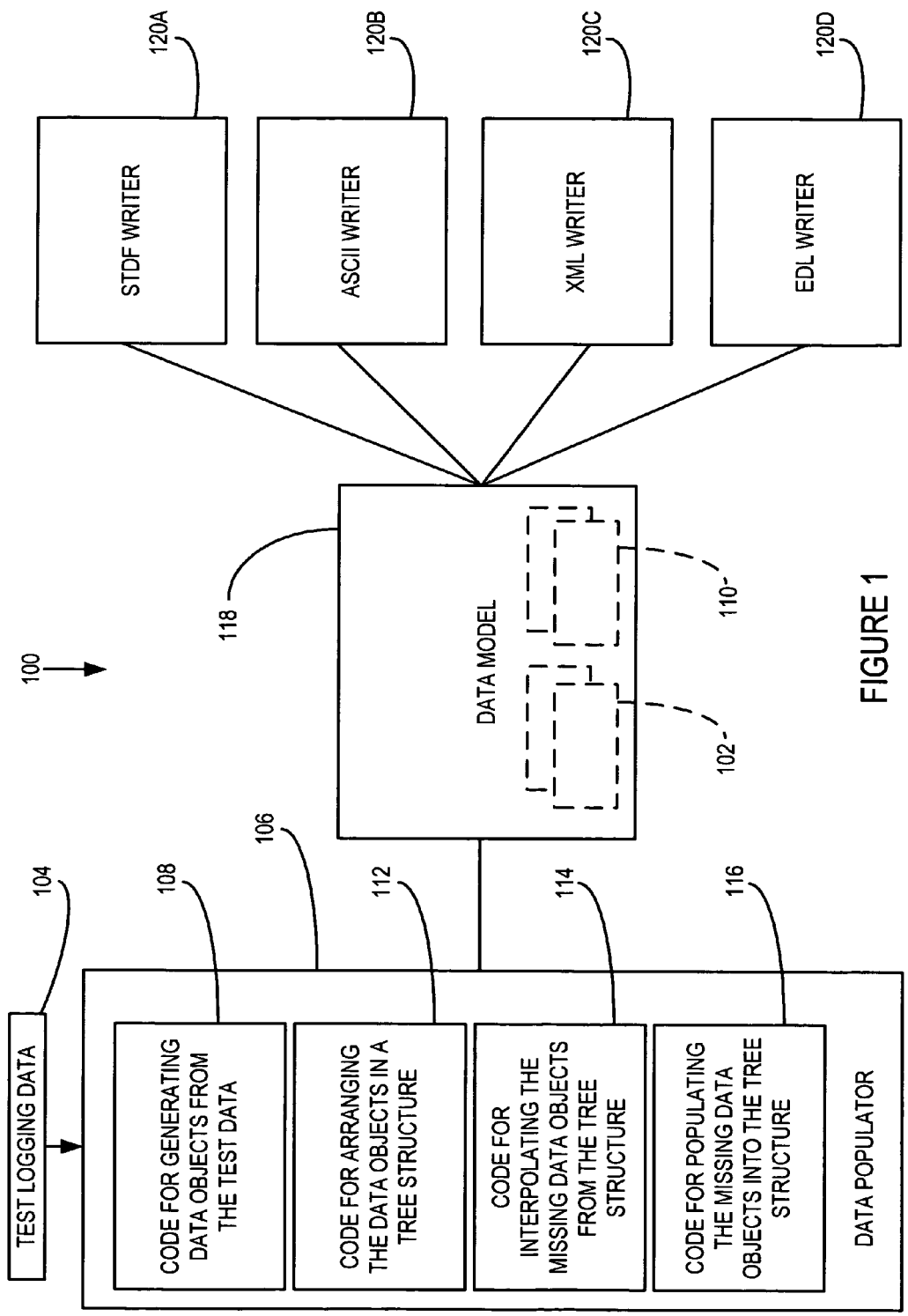
FIG. 1 is a diagrammatic illustration of one embodiment of a system for derivation of missing data objects from test data.
Figure 2:
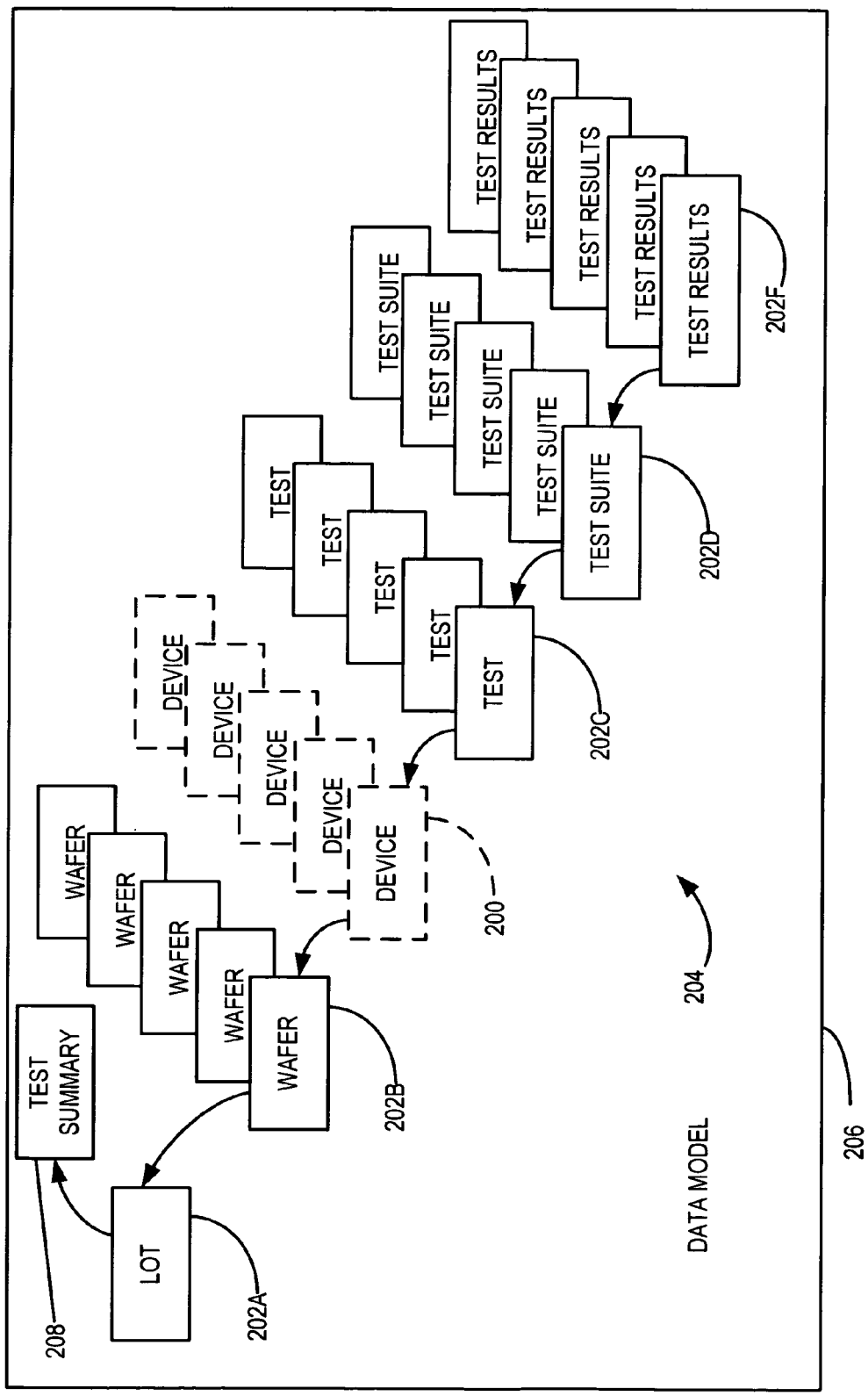
FIG. 2 is a schematic illustration of an exemplary embodiment of a data model for use in the system of FIG. 1.

Referring to FIGS. 1 and 2, there is shown a system 100 for derivation of missing data objects 102/200 from test data 104. In an embodiment, system 100 may comprise a data populator 106. In one embodiment, data populator 106 may have code 108 for generating data objects 110/202A-202D, 202F from test data 104. Data populator 106 may have code 112 for arranging data objects 110/202A-202D, 202F in a tree structure 204. Data populator 106 may have code 114 for deriving missing data objects 102/200 from tree structure 204. Data populator 106 may have code 116 for populating missing data objects 102/200 into tree structure 204. In an embodiment, data objects 110/202A-202D, 202F may include, for example, a lot data object 202A, wafer data objects 202B, test data objects 202C, test suite data objects 202D and test result data objects 202F.

Referring still to FIGS. 1 and 2, there is shown a data model 118/206 in communication with data populator 106. In an embodiment, data model 118/206 may store data objects 110/202A-202D, 202F and missing objects 102/200 generated by data populator 106. In an embodiment, a test summary data object 208 is generated adjacent to a parent object, e.g., lot object 202A, to accumulate statistics and other data relevant to the parent object's child objects, e.g. wafers 202B, tests 202C, test suites 202D and test results 202F.

Looking at FIG. 1, there is shown a plurality of clients 120A-120D in communication with data model 118/206. In an embodiment, clients 120A-120D may each selectively read data objects 110 and missing data objects 102/200 stored by data model 118/208.

Generally, data objects 110/202A-202D, 202F and missing data objects 102/200 generated by data populator 106 form a uniform set of objects. In an embodiment, each one of the plurality of clients 102A-102D selectively reads from the uniform set of objects. In one embodiment, different ones of the plurality of clients 120A-120F obtain standardized data from the uniform set of objects. The uniform set of objects of data objects 110/202A-202D, 202F and missing data objects 102/200 may be stored in a single location, which may include, but is not limited to, data model 118/206.

Referring to FIG. 1, the plurality of clients 120A-120D may include data formatters 120A-120D. In one embodiment, data formatters 120A-120D may include an STDF writer 120A, an ASCII writer 120B, an XML writer 120C, an EDL writer 120D, or another type of data writer.

Referring still to FIG. 1, and in an embodiment, test data 104 is logged as data objects 110, and any necessary context information for missing events 102 is derived at a single location. Generally, missing events 102 are in turn populated into a single location, which is typically data model 118. As such, all processes of data formatters 120A-120D access the same "derived" context information. Furthermore, data formatters 120A-120D do not require additional logic to handle situations with missing data events.

Derivation of missing data objects 102 may include data interpretation, data interpolation and/or data derivation. This derivation of missing data elements 102 is a single process for each batch of test data 104. The processed data, which may include missing data objects 102 and generated data objects 110, may be made available for multiple data formatters 120A-120D.

As all processing logic for derivation of missing events 102 may be located within data populator 106, rather than in each of data formatters 120A-120D, it may be less cumbersome to program a new data formatter 120A-120D for use in system 100. Likewise, as each new data formatter 120A-120D does not require processing logic for derivation of missing events 102 or data objects 110, the programming for each new data formatter is less error prone.

System 100 provides increased performance for processing test data 104 with multiple data formatters, i.e., data formatters 120A-120D, as missing data objects 102 are created once with a single set of logic.

In another embodiment, data populator 106 may have code 108 for generating data objects 110/202A-202D, 202F from test data 104. Data populator 106 may have code 112 for arranging data objects 110/202A-202D, 202F in a relational structure (not shown). Data populator 106 may have code 114 for deriving missing data objects 102/200 from the relational structure (not shown). Data populator 106 may have code 116 for populating missing data objects 102/200 into the relational structure (not shown).

Figure 3:
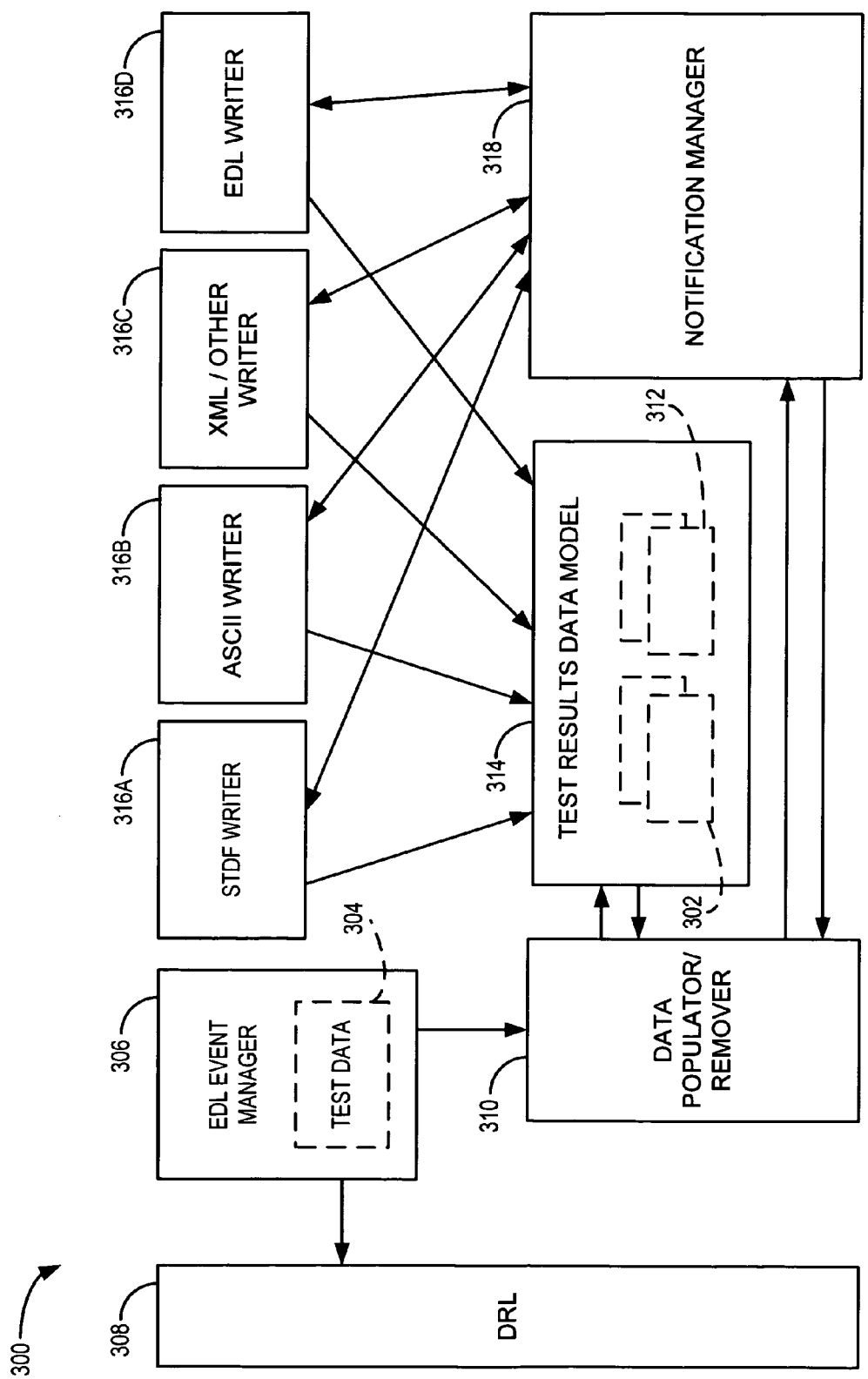
FIG. 3 is a diagrammatic illustration of another embodiment of a system for derivation of missing data objects from test data.

Looking at FIG. 3, and in an embodiment, there is shown a system 300 for derivation of missing data objects 302 from test data 304.

In one embodiment, event data logging manager 306, which is also referred to as EDL manager 306, may provide test data 304 into system 300. Furthermore, a data resource library 308, which is also referred to as DRL 308, may provide test data 304 into EDL manager 306.

In an embodiment, system 300 may comprise a data populator 310. In one embodiment, data populator 310 may have code as described above for generating data objects 312 from test data 304. Data populator 310 may have code as described above for arranging data objects 312 in a tree structure. Data populator 310 may have code as described above for deriving missing data objects 302 from the tree structure.

Data populator 310 may have code as described above for populating missing data objects 302 into the tree structure. In an embodiment, a notification manager 318 is in communication with data populator 310 and clients 316A-316D. Notification manager 318 may notify clients 316A-316D of data objects 312 and missing data objects 302 generated by data populator 310. Clients 316A-316D may each selectively read data objects 312 and missing data objects 302 stored in data model 314.

In another embodiment, system 300 may comprise a data populator 310. In one embodiment, data populator 310 may have code as described above for generating data objects 312 from test data 304. Data populator 310 may have code as described above for arranging data objects 312 in a relational structure. Data populator 310 may have code as described above for deriving missing data objects 302 from the relational structure.

Data populator 310 may have code as described above for populating missing data objects 302 into the relational structure. In an embodiment, a notification manager 318 is in communication with data populator 310 and clients 316A-316D. Notification manager 318 may notify clients 316A-316D of data objects 312 and missing data objects 302 generated by data populator 310. Clients 316A-316D may each selectively read data objects 312 and missing data objects 302 stored in data model 314.

Generally, a data populator, or another component of a data processing system separate from one or more data formatters, receives test data, generates data objects, performs any necessary data derivation, data interpretation or data interpolation of the generated data objects, and populates any missing data objects that may be derived from the generated data object. Data formatters may be notified of the data, including missing data objects and generated data objects. Data formatters may in turn have access to this single set of information generated by data populator.

Figure 4:
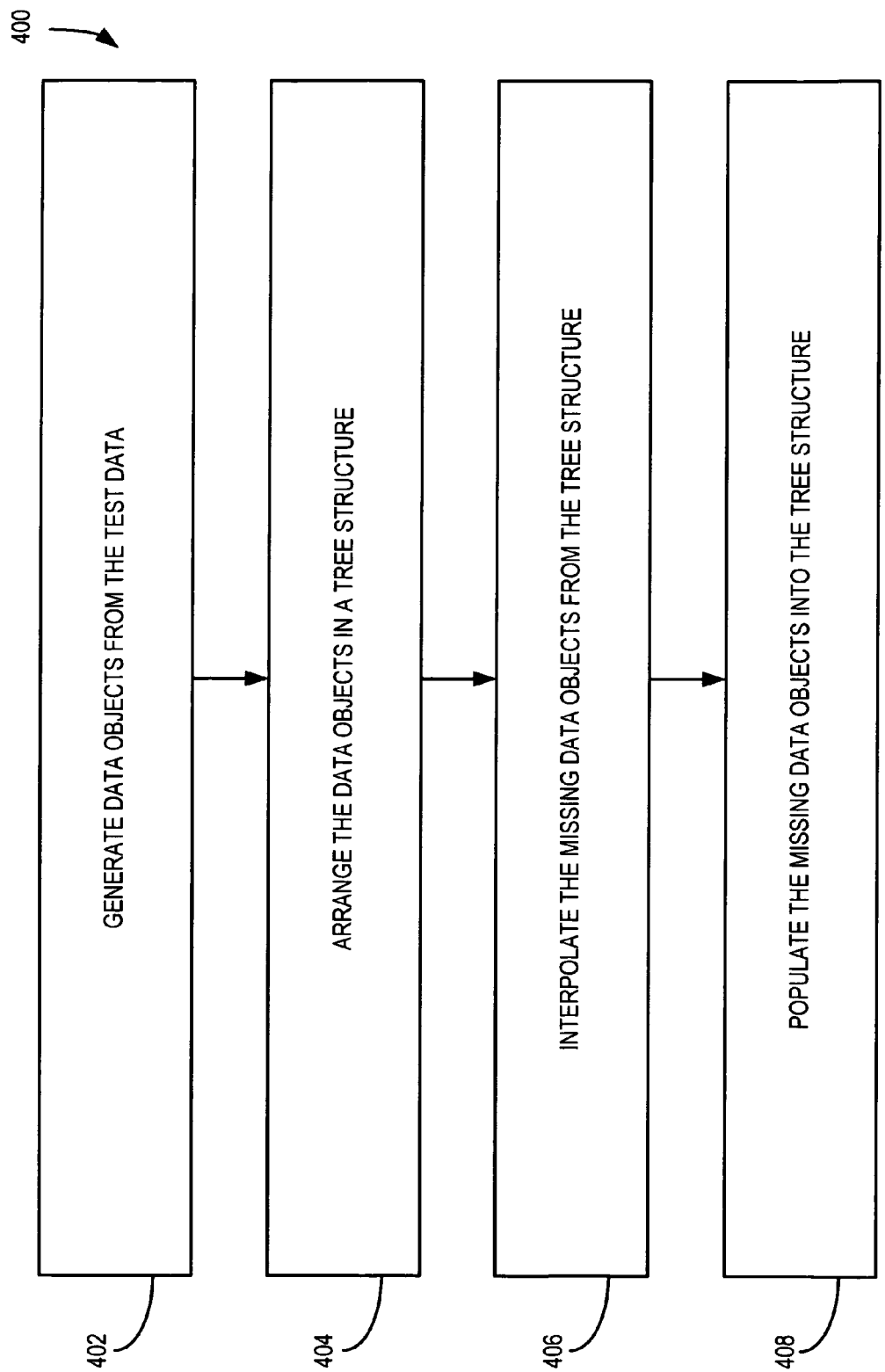
FIG. 4 is a flow diagram illustrating one method of derivation of missing data objects from test data.

Referring now to FIG. 4, and in an embodiment, there is shown a method 400 of derivation of missing data objects from test data. Method 400 may comprise the step of generating 402 data objects from the test data. Method 400 may comprise the step of arranging 404 the data objects in a tree structure. Method 400 may comprise the step of deriving 406 the missing data objects from the tree structure. Method 400 may comprise the step of populating 408 the missing data objects into the tree structure.

In an embodiment, the step of generating 402 data objects from the test data may occur at a data populator having code for generation of the data objects. Furthermore, the step of arranging 404 the data objects in a tree structure may occur at a data populator having code for arrangement of the data objects. In addition, the step of deriving 406 the missing data objects from the tree structure may occur at a data populator having code for derivation of the missing data objects. Optionally, the step of populating 408 the missing data objects into the tree structure may occur at a data populator having code for population of the missing data objects.

Figure 5:
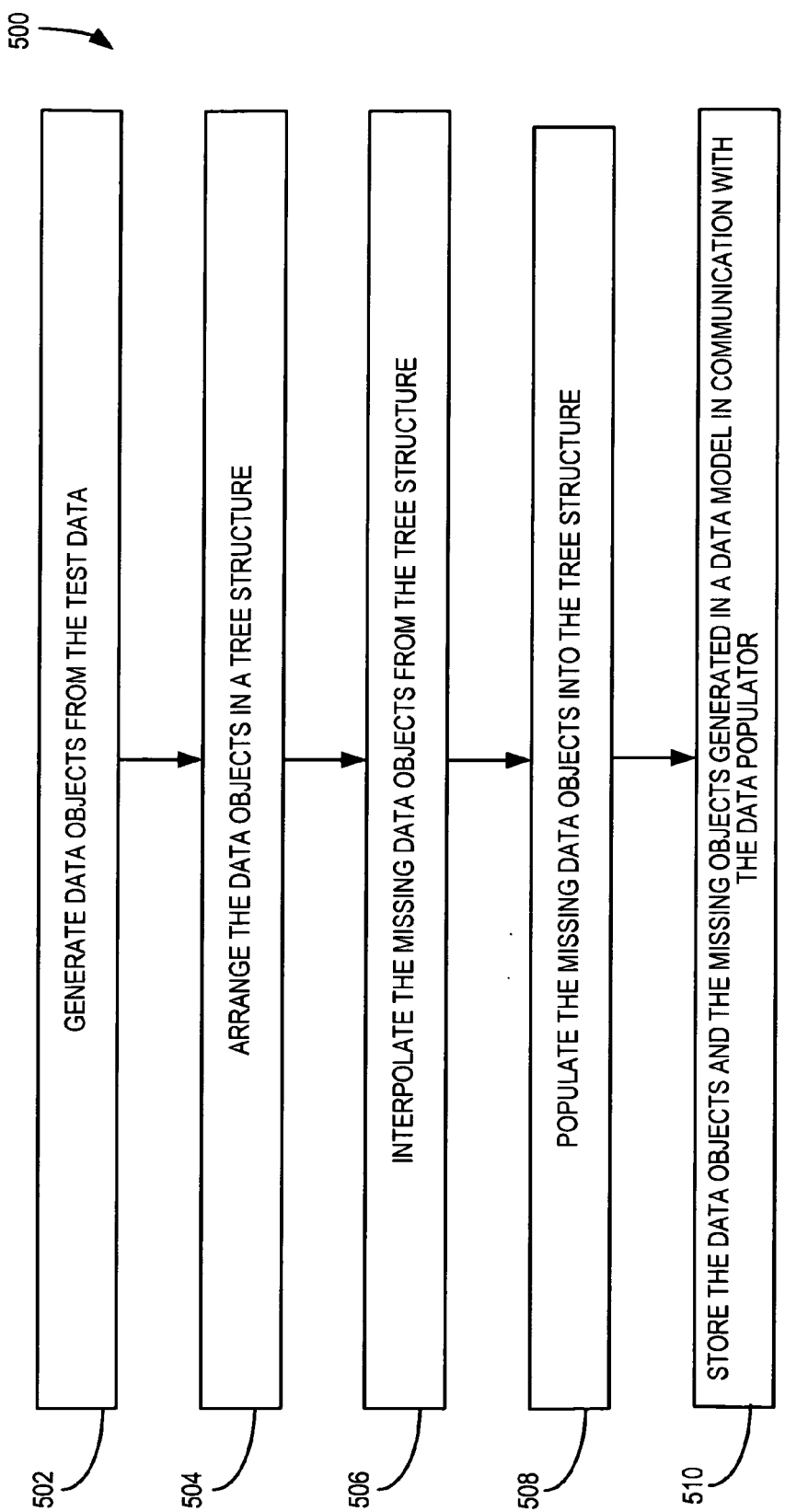
FIG. 5 is a flow diagram of another method of derivation of missing data objects from test data.

Referring now to FIG. 5, and in an embodiment, there is shown a method 500 of derivation of missing data objects from test data.

Method 500 may comprise the step of generating 502 data objects from the test data. Method 500 may comprise the step of arranging 504 the data objects in a tree structure. Method 500 may comprise the step of deriving 506 the missing data objects from the tree structure. Method 500 may comprise the step of populating 508 the missing data objects into the tree structure. Method 500 may further comprise storing 510 the data objects and the missing objects generated in a data model in communication with the data populator.

Figure 6:
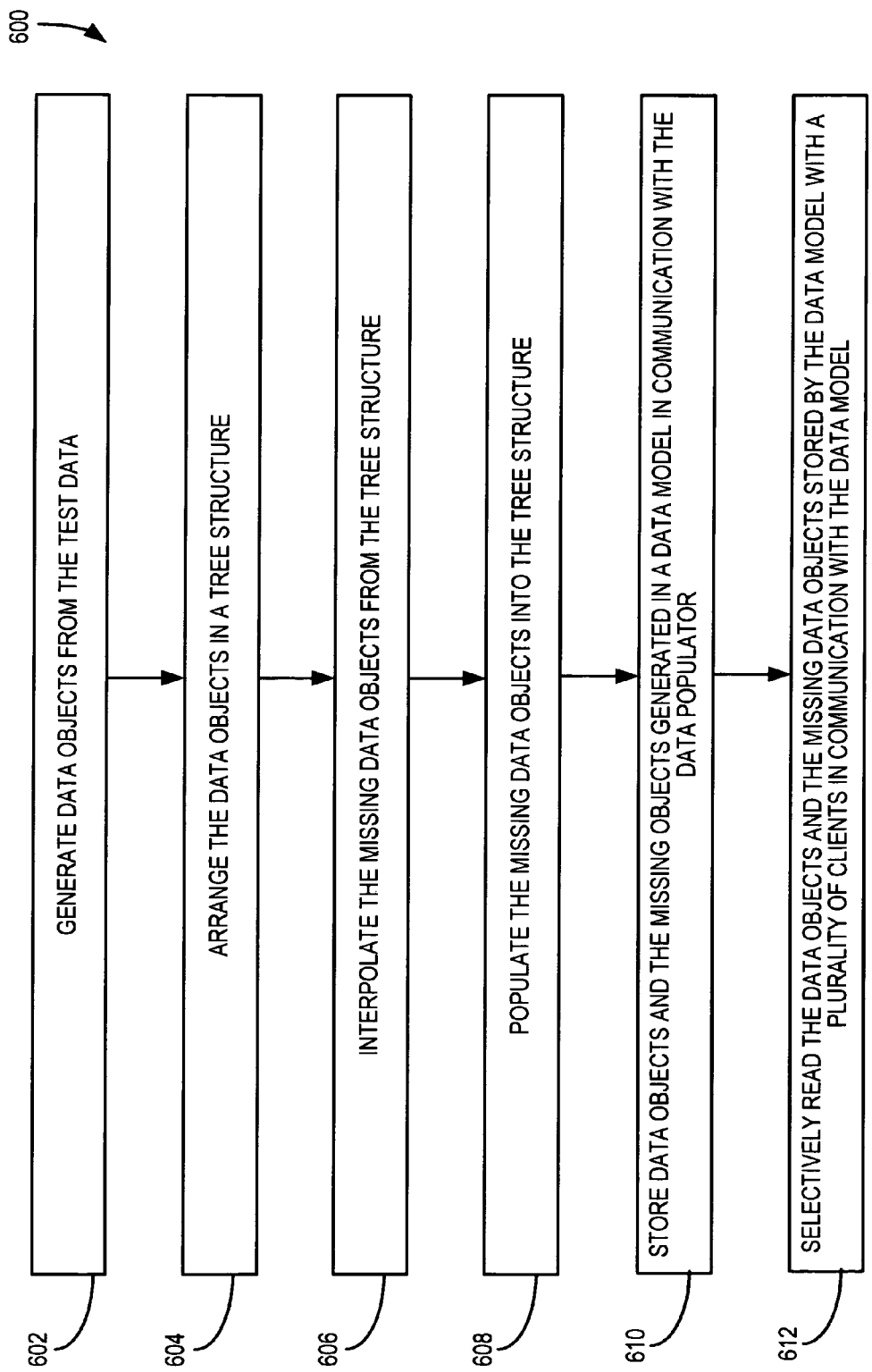
FIG. 6 is a flow diagram of a method of derivation of missing data objects from test data.

Referring to FIG. 6, and in an embodiment, there is shown a method 600 of derivation of missing data objects from test data.

Method 600 may comprise the step of generating 602 data objects from the test data. Method 600 may comprise the step of arranging 604 the data objects in a tree structure. Method 600 may comprise the step of deriving 606 the missing data objects from the tree structure. Method 600 may comprise the step of populating 608 the missing data objects into the tree structure. Method 600 may comprise storing 610 the data objects and the missing objects generated in a data model in communication with the data populator. Method 600 may further comprising selectively reading 612 the data objects and the missing data objects stored by the data model with a plurality of clients in communication with the data model.

Figure 7:
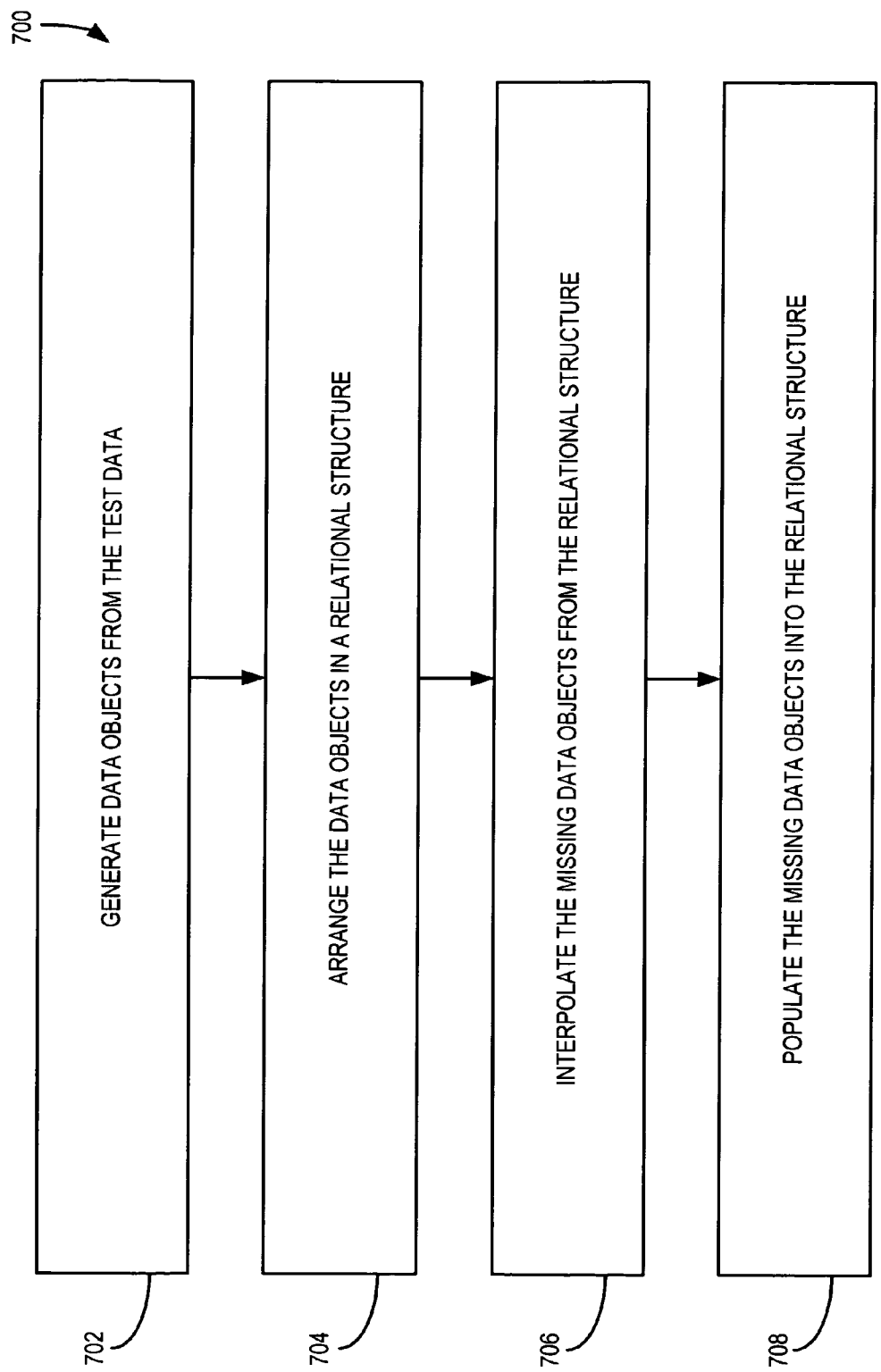
FIG. 7 is a flow diagram illustrating one method of derivation of missing data objects from test data.

Referring now to FIG. 7, and in an embodiment, there is shown a method 700 of derivation of missing data objects from test data. Method 700 may comprise the step of generating 702 data objects from the test data. Method 700 may comprise the step of arranging 704 the data objects in a relational structure. Method 700 may comprise the step of deriving 706 the missing data objects from the relational structure. Method 700 may comprise the step of populating 708 the missing data objects into the relational structure.

In an embodiment, the step of generating 702 data objects from the test data may occur at a data populator having code for generation of the data objects. Furthermore, the step of arranging 704 the data objects in a relational structure may occur at a data populator having code for arrangement of the data objects. In addition, the step of deriving 706 the missing data objects from the relational structure may occur at a data populator having code for derivation of the missing data objects. Optionally, the step of populating 708 the missing data objects into the relational structure may occur at a data populator having code for population of the missing data objects.

Figure 8:
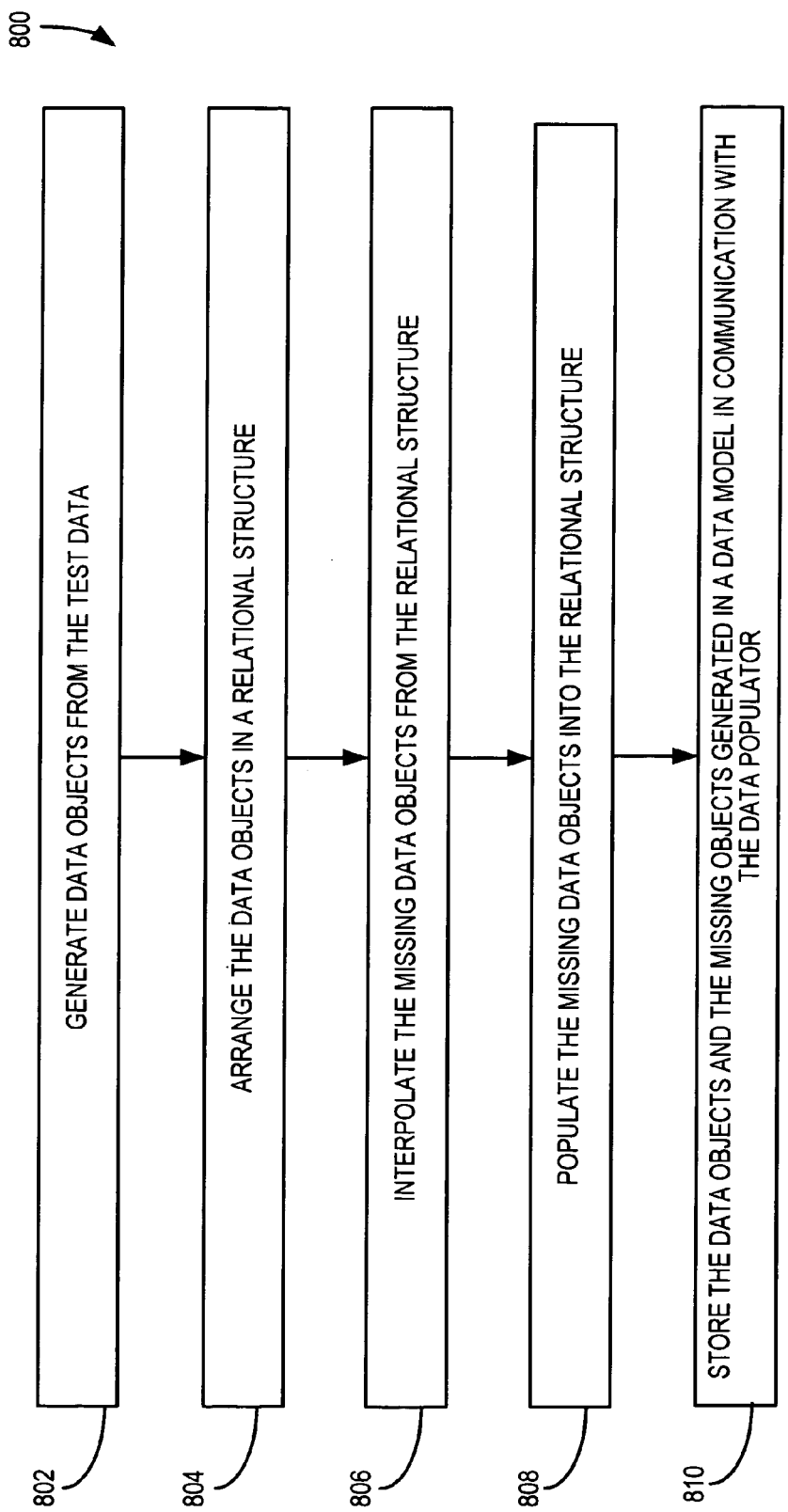
FIG. 8 is a flow diagram of another method of derivation of missing data objects from test data.

Referring now to FIG. 8, and in an embodiment, there is shown a method 800 of derivation of missing data objects from test data.

Method 800 may comprise the step of generating 802 data objects from the test data. Method 800 may comprise the step of arranging 804 the data objects in a relational structure. Method 800 may comprise the step of deriving 806 the missing data objects from the relational structure. Method 800 may comprise the step of populating 808 the missing data objects into the relational structure. Method 800 may further comprise storing 810 the data objects and the missing objects generated in a data model in communication with the data populator.

Figure 9:
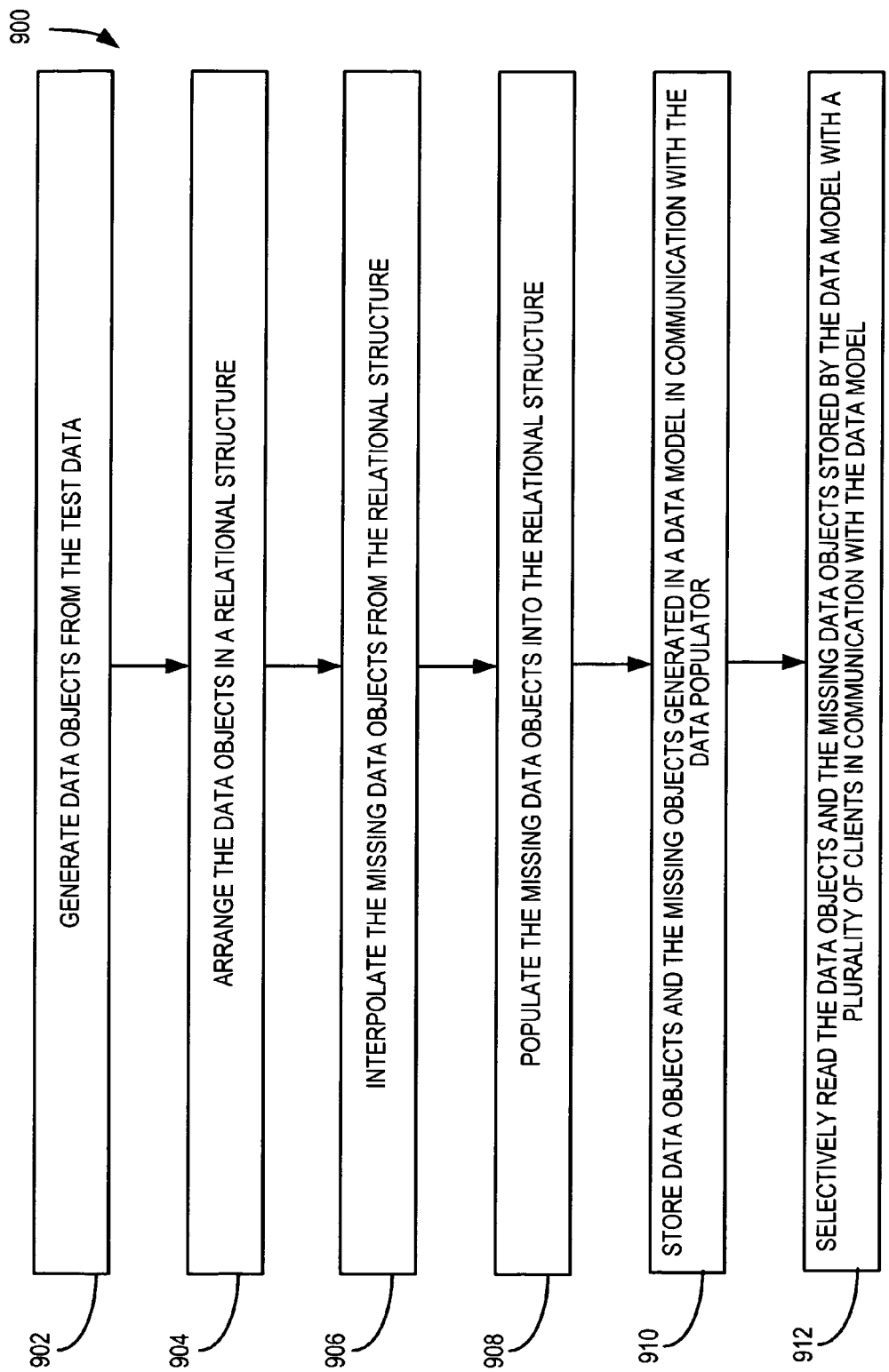
FIG. 9 is a flow diagram of a method of derivation of missing data objects from test data.

Referring now to FIG. 9, method 900 may comprise the step of generating 902 data objects from the test data. Method 900 may comprise the step of arranging 904 the data objects in a relational structure. Method 900 may comprise the step of deriving 906 the missing data objects from the relational structure. Method 900 may comprise the step of populating 908 the missing data objects into the relational structure. Method 900 may comprise storing 910 the data objects and the missing objects generated in a data model in communication with the data populator. Method 900 may further comprising selectively reading 912 the data objects and the missing data objects stored by the data model with a plurality of clients in communication with the data model.

Figure 10:
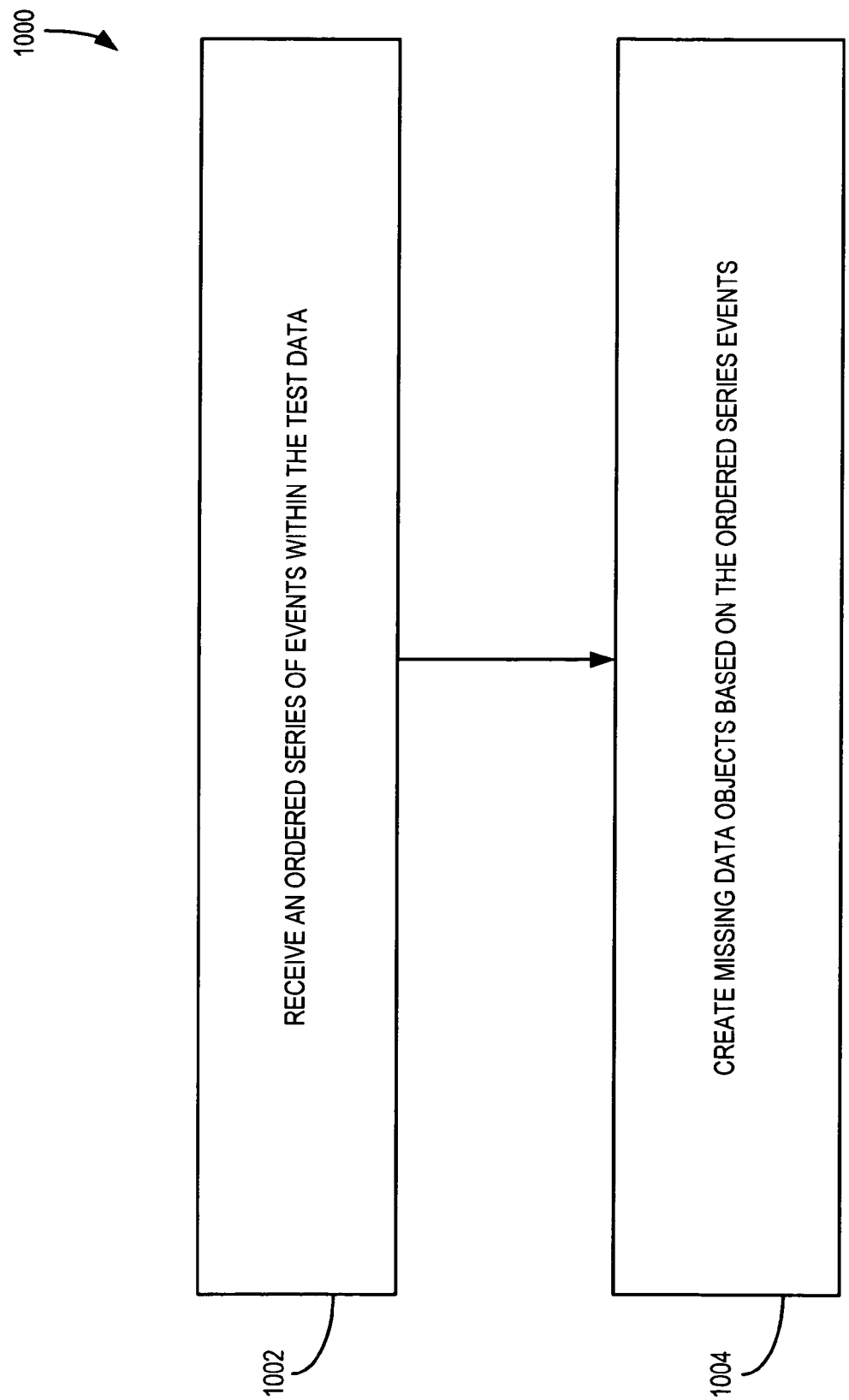
FIG. 10 is a flow diagram of a method of derivation of missing data objects from test data.

Referring now to FIG. 10, and in one embodiment, there is shown a method 1000 of derivation of missing data objects from test data. Method 1000 may include the step of receiving 1002 an ordered series of events within the test data. Method 100 may further include the step of creating 1004 missing data objects based on the ordered series events. In an embodiment, the ordered series of events skips the missing data objects, and the missing data objects are expected within the ordered series of events within the test data.

What is claimed is:

1. A system for derivation of missing data objects from test data, the system comprising:
   a data populator having code for: (1) generating data objects from the test data, (2) arranging the data objects in a tree structure, (3) deriving the missing data objects from the tree structure, and (4) populating the missing data objects into the tree structure;
   a data model in communication with the data populator, wherein the data model stores the data objects and the missing objects generated by the data populator; and
   a plurality of clients in communication with the data model, wherein the clients each selectively read the data objects and the missing data objects stored by the data model, and wherein the clients include at least one data formatter that formats and outputs data obtained from the data objects and the missing data objects read by the at least one data formatter.

2. A system in accordance with claim 1, wherein the data objects and the missing data objects generated by the data populator form a uniform set of objects, wherein each one of the plurality of clients selectively reads from the uniform set of objects, and wherein different ones of the plurality of clients obtain standardized data from the uniform set of objects.

3. A system in accordance with claim 1, wherein the at least one data formatter includes at least one chosen from the group consisting of an STDF writer, an ASCII writer, an XML writer, and an EDL writer.

4. A system in accordance with claim 1, wherein a notification manager is in communication with the data populator and the clients, wherein the notification manager notifies the clients of the data objects and missing data objects generated by the data populator, and wherein the clients each selectively read the data objects and missing data objects stored in the data model.

5. The system in accordance with claim 1, wherein at least one of the data formatters outputs data to a file.

6. The system in accordance with claim 1, wherein at least one of the data formatters outputs data to a text report.

7. A system for derivation of missing data objects from test data, the system comprising:
   a data populator having code for: (1) generating data objects from the test data, (2) arranging the data objects in a relational structure relative to one another, (3) deriving the missing data objects from the relational structure, and (4) populating the missing data objects into the relational structure; and
   a plurality of clients in communication with the data populator, wherein the clients each selectively obtain the data objects and the missing data objects generated and derived by the data populator, respectively, and wherein the clients include at least one data formatter that formats and outputs data obtained from the data objects and the missing data objects obtained by the at least one data formatter.

8. A system in accordance with claim 7, wherein the data objects generated by the data populator and the missing data objects derived by the data populator form a uniform set of objects, wherein each one of the plurality of clients selectively obtains standardized data from the uniform set of objects.

9. A system in accordance with claim 7, wherein the at least one data formatter includes at least one chosen from the group consisting of an STDF writer, an ASCII writer, an XML writer, and an EDL writer.

10. A system in accordance with claim 7, wherein a notification manager is in communication with the data populator and the clients, wherein the notification manager notifies the clients of the data objects and missing data objects generated by the data populator, and wherein the clients each selectively obtain the data objects and missing data objects stored in the data model.

11. A method of derivation of missing data objects from test data, the method comprising:

generating data objects from the test data;

arranging the data objects in a tree structure;

deriving the missing data objects from the tree structure;

populating the missing data objects into the tree structure; and selectively reading the data objects and the missing data objects in the tree structure with a plurality of clients that are in communication with the tree structure, the clients including at least one data formatter that formats and outputs data obtained from the data objects and the missing data objects read by the at least one data formatter.

12. A method in accordance with claim 11, wherein generating data the objects from the test data occurs at a data populator having code therefor.

13. A method in accordance with claim 11, wherein arranging the data objects in a tree structure occurs at a data populator having code therefor.

14. A method in accordance with claim 11, wherein deriving the missing data objects from the tree structure occurs at a data populator having code therefor.

15. A method in accordance with claim 11, wherein populating the missing data objects into the tree structure occurs at a data populator having code therefor.

16. A method in accordance with claim 11, further comprising storing the data objects and the missing objects generated in a data model in communication with the data populator.

17. A method of derivation of missing data objects from test data, the method comprising:

generating data objects from the test data;

arranging the data objects in a relational structure relative to one another;

deriving the missing data objects from the relational structure;

populating the missing data objects into the relational structure; and selectively reading the data objects and the missing data objects in the relational structure with a plurality of clients that are in communication with the relational structure, the clients including at least one data formatter that formats and outputs data obtained from the data objects and the missing data objects read by the at least one data formatter.

18. A method in accordance with claim 17, wherein generating data the objects from the test data occurs at a data populator having code therefor.

19. A method in accordance with claim 17, wherein arranging the data objects in a relational structure occurs at a data populator having code therefor.

20. A method in accordance with claim 17, wherein deriving the missing data objects from the relational structure occurs at a data populator having code therefor.

21. A method in accordance with claim 17, wherein populating the missing data objects into the relational structure occurs at a data populator having code therefor.

22. A method in accordance with claim 17, further comprising storing the data objects and the missing objects generated in a data model in communication with the data populator.

* * * * *